United States Patent
Bentley et al.

(10) Patent No.: US 12,183,814 B1
(45) Date of Patent: Dec. 31, 2024

(54) MULTI-CHANNEL TRANSISTOR

(71) Applicant: GlobalFoundries U.S. Inc., Malta, NY (US)

(72) Inventors: Steven J. Bentley, Menands, NY (US); Francois Hebert, San Mateo, CA (US); Lawrence Selvaraj Susai, South Burlington, VT (US); Johnatan A Kantarovsky, South Burlington, VT (US); Michael Zierak, Colchester, VT (US); Mark D. Levy, Williston, VT (US); John Ellis-Monaghan, Grand Isle, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 0 days.

(21) Appl. No.: 18/615,615

(22) Filed: Mar. 25, 2024

(51) Int. Cl.
    *H01L 29/778* (2006.01)
    *H01L 29/20* (2006.01)
    *H01L 29/66* (2006.01)

(52) U.S. Cl.
    CPC ...... *H01L 29/7783* (2013.01); *H01L 29/2003* (2013.01); *H01L 29/66431* (2013.01); *H01L 29/66462* (2013.01); *H01L 29/7786* (2013.01)

(58) Field of Classification Search
    CPC .......... H01L 29/7783; H01L 29/66431; H01L 29/66462
    See application file for complete search history.

(56) References Cited

U.S. PATENT DOCUMENTS

| | | | |
|---|---|---|---|
| 10,985,253 B2 | 4/2021 | Matioli et al. | |
| 12,051,741 B2* | 7/2024 | Nishiguchi | H01L 29/7783 |
| 2018/0219086 A1* | 8/2018 | Higuchi | H01L 29/7783 |
| 2020/0203484 A1* | 6/2020 | Nidhi | H01L 29/66462 |
| 2020/0411663 A1* | 12/2020 | Saptharishi | H01L 29/778 |
| 2022/0085198 A1* | 3/2022 | Nishiguchi | H01L 29/0843 |
| 2024/0097017 A1* | 3/2024 | Baringhaus | H01L 29/7786 |

FOREIGN PATENT DOCUMENTS

| | | |
|---|---|---|
| CN | 113990947 A | 1/2022 |
| CN | 115332322 A | 11/2022 |

OTHER PUBLICATIONS

M. Xiao et al., "Multi-Channel Monolithic-Cascode HEMT (MC2-HEMT): A New GaN Power Switch up to 10 kV", 2021 IEEE International Electron Devices Meeting (IEDM), San Francisco, CA, USA, 2021, pp. 5.5.1-5.5.4, doi: 10.1109/IEDM19574.2021.9720714, 4 pages.

(Continued)

*Primary Examiner* — Joseph C. Nicely
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to multi-channel transistors and methods of manufacture. The structure includes: a gate structure; a single channel layer in a channel region under the gate structure; a drift region adjacent to the gate structure; and multiple channel layers in the drift region coupled to the single channel layer under the gate structure.

20 Claims, 5 Drawing Sheets

(56) References Cited

OTHER PUBLICATIONS

Luca Nela et al., "A perspective on multi-channel technology for the next-generation of GaN power devices", Applied Physics Letters, Special Collection: Wide- and Ultrawide-Bandgap Electronic Semiconductor Devices, Research Article, Published May 11, 2022, https://doi.org/10.1063/5.0086978, 9 pages.

L Nela et al., "Multi-channel nanowire devices for efficient power conversion", Nat Electron 4, 284-290 (2021). https://doi.org/10.1038/s41928-021-00550-8, 24 pages.

Robert S. Howell et al., "The Super-Lattice Castellated Field Effect Transistor (SLCFET): A Novel High Performance Transistor Topology Ideal for RF Switching", 2014 IEEE International Electron Devices Meeting, San Francisco, CA, USA, 2014, pp. 11.5.1-11.5.4, doi: 10.1109/IEDM.2014.7047033, 4 pages.

\* cited by examiner

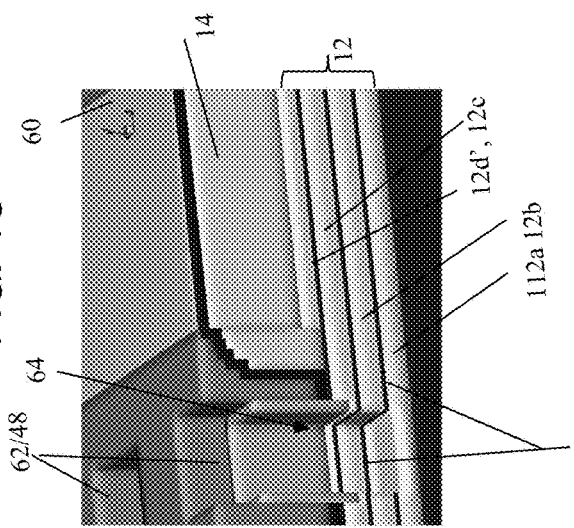
FIG. 4A  FIG. 4B  FIG. 4C
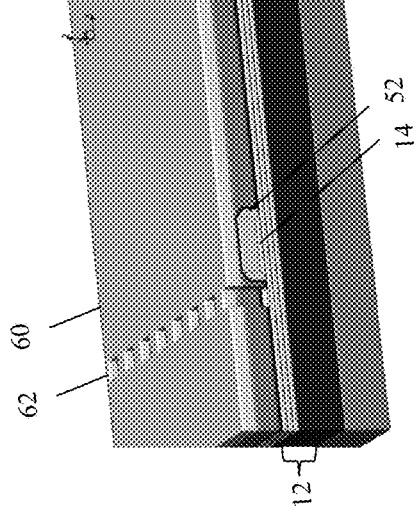
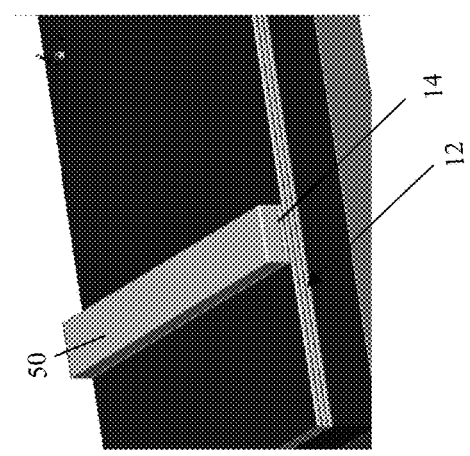
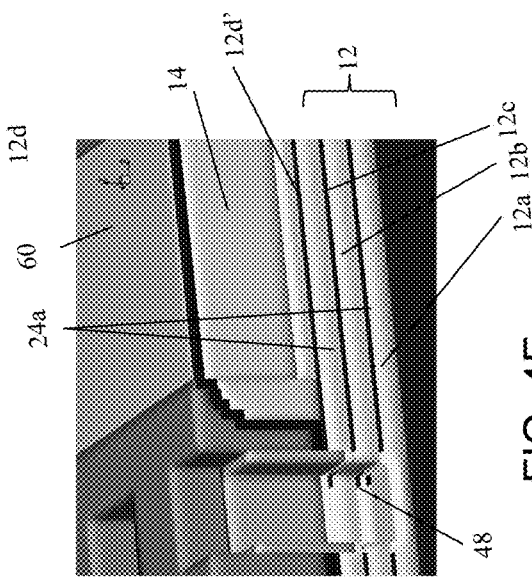
FIG. 4E
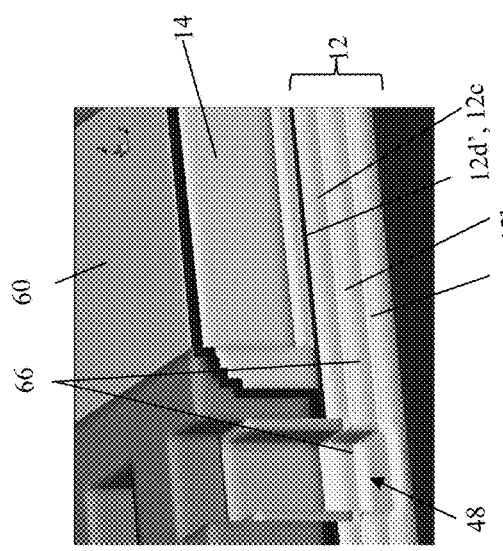
FIG. 4D

MULTI-CHANNEL TRANSISTOR

This invention was made with government support under contract HQO757790700 awarded by DMEA. The government has certain rights in the invention.

BACKGROUND

The present disclosure relates to semiconductor structures and, more particularly, to multi-channel transistors and methods of manufacture.

A high-electron-mobility transistor (HEMT) is a field-effect transistor incorporating a junction between two materials with different band gaps (i.e. a heterojunction) as the channel, instead of a doped region (as is generally the case for a MOSFET). Commonly used material families are GaN or GaAs, although other materials can be used, dependent on the application of the device.

Due to the higher critical field and switching figures of merit of the GaN materials system, GaN HEMT devices typically have a higher electric-field strength than silicon MOSFETS, providing substantial performance improvements in, for example, on-resistance and breakdown voltage, while offering fast switching speed, amongst other important parameters. Since these properties result in fundamentally higher system efficiency, HEMTs may be used in diverse power management applications, such as AC-DC and DC-DC conversion in the consumer or automotive space. In RF applications, they may be used in high frequency power amplifiers, low noise amplifiers or switches in such applications as cell phones, satellite or receivers or radar equipment.

SUMMARY

In an aspect of the disclosure, a structure comprises: a gate structure; a single channel layer in a channel region under the gate structure; a drift region adjacent to the gate structure; and multiple channel layers in the drift region coupled to the single channel layer under the gate structure.

In an aspect of the disclosure, a structure comprises: a gate structure; a channel region under the gate structure; and a drift region adjacent to the gate structure, wherein the channel region comprises a single channel and the drift region comprising a stack of channel layers electrically strapped together and connecting to a drain ohmic contact.

In an aspect of the disclosure, a method comprises: forming a gate structure; forming a single channel layer in a channel region under the gate structure; forming a drift region adjacent to the gate structure; and forming multiple channel layers in the drift region coupled to the single channel layer under the gate structure.

BRIEF DESCRIPTION OF THE DRAWINGS

The present disclosure is described in the detailed description which follows, in reference to the noted plurality of drawings by way of non-limiting examples of exemplary embodiments of the present disclosure.

FIGS. 4A-4E show fabrication processes for manufacturing the structure of FIG. 2 in accordance with aspects of the present disclosure.

DETAILED DESCRIPTION

The present disclosure relates to semiconductor structures and, more particularly, to multi-channel transistors and methods of manufacture. More specifically, the multi-channel transistors may be high-electron-mobility transistors (HEMTs) utilizing GaN/AlGaN structures. In more specific embodiments, the HEMT may be an enhancement mode device (e-mode), including multiple stacked channels in the drift region of the device. The stacked channels reduce overall resistance in the drift region by enabling parallel conduction paths in the 2DEGs forming each of the channels. Accordingly, and advantageously, by using the stacked channel in the drift region of the device, it is possible to achieve an ultra-low on-resistance (Rdson) with a large voltage handling capability.

In more specific embodiments, the HEMT comprises a channel region having a first portion with multiple stacked channels and a second portion with a single channel. The single channel may be a top channel of the multiple stack channel. A gate structure may be provided over the second portion of the channel region. Metal via structures may be positioned within the first portion between the gate and the drain region. The metal via structures couple the multiple stacked channels and connect to a drain ohmic contact in the drain region. An isolation region may be provided underneath the single channel. The isolation region electrically isolates the lower stacked channels from the single top channel. The isolation region may be a disordered semiconductor region comprising an implantable element (e.g., N, Ar, Ga, etc.), or dielectric layers interposed between the semiconductor layers. A trench may be formed in the multiple stacked channels between the gate structure and a source contact.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, implantation can be used to introduce new elements or modify existing structures, and rapid thermal anneal processes may be used to drive-in dopants or material layers as is known in the art.

Figure 1:
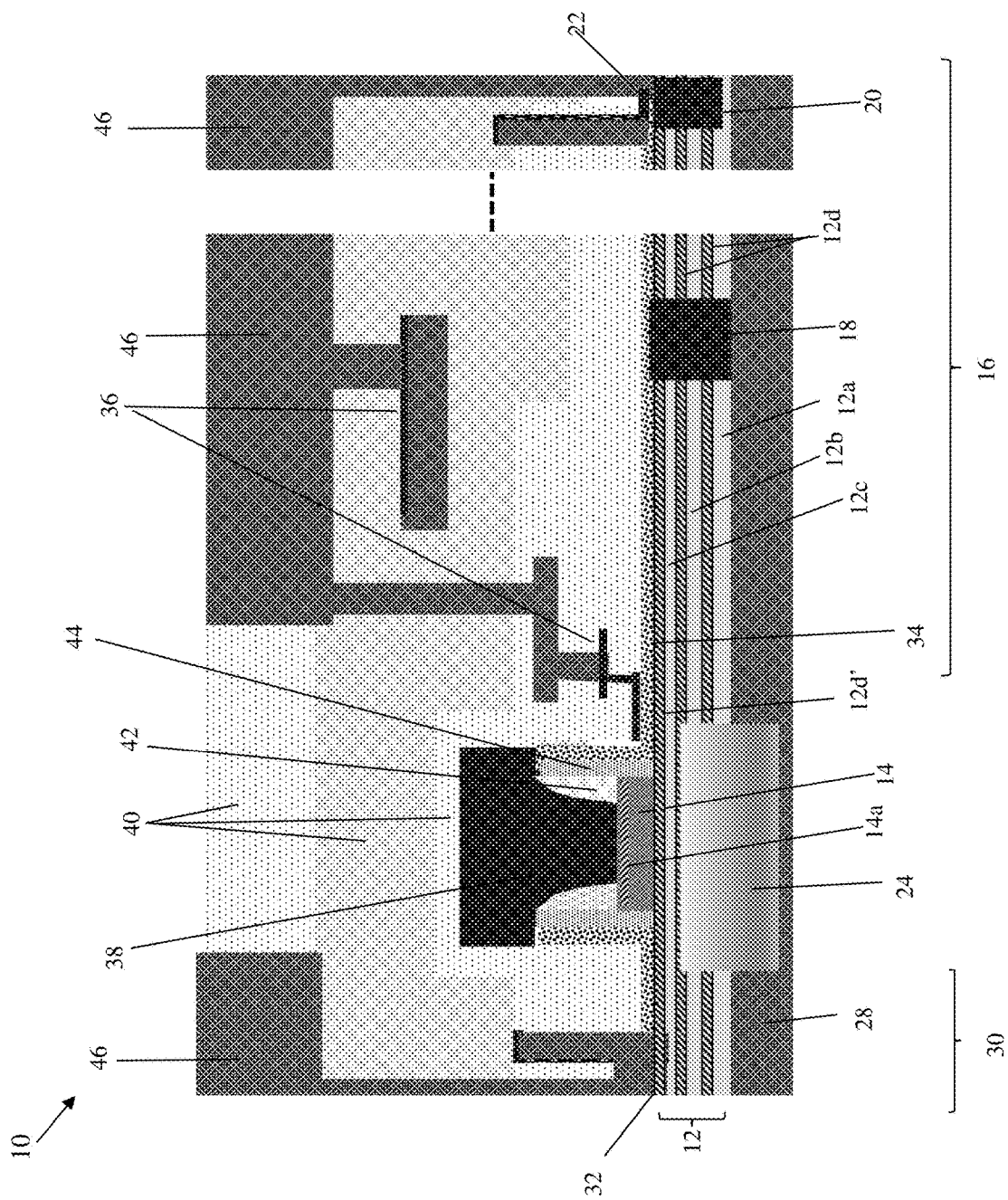
FIG. 1 shows a structure and respective fabrication processes in accordance with aspects of the present disclosure.

FIG. 1 shows a structure and respective fabrication processes in accordance with aspects of the present disclosure. More specifically, the structure 10 of FIG. 1 may be a HEMT comprising a p-doped gate structure 14 with a stacked channel region 12 in a drift region 16. In the drift region 16, for example, the stacked channel region 12 may comprise multiple layers of GaN material 12a, 12b, 12c, separated by or interposed with barrier layers of AlGaN material 12d, 12d'. It should be understood by those of skill in the art that other material combinations may also be used as is known in the art for HEMT devices, including InGaN, InAlN, AlN and a broad range of semiconductors. In the drift region 16, a buried via structure 18 and a buried via structure 20 under a drain ohmic contact 22 may electrically connect or couple the multiple layers of GaN material 12a, 12b, 12c and AlGaN material 12d, 12d' to provide a parallel conduction channel from the top single layer 12c of the stacked channel 12 under the gate structure 14 to the drain ohmic contact 22. In this way, the drift region 16 will exhibit an ultra-low drift resistance (Rdson) with a large voltage handling capability.

In further embodiments, a single conducting layer of GaN material, e.g., top layer 12c, and a single layer of AlGaN material, e.g., top barrier layer 12d', may be utilized under the p-doped gate structure 14. To have the top layers of the GaN material 12c and AlGaN material 12d' as a channel under the p-doped gate structure 14, a buried isolation structure 24 may be provided under the p-doped gate structure 14, extending through a portion of the stacked channel region 12, e.g., bottom layers 12a, 12b, 12d.

More specifically, the structure 10 includes a stacked channel region 12, e.g., channel layers 12a, 12b, 12c alternating with barrier layers 12d, 12d' and may be formed on top of additional buffer or interfacial layers formed on a semiconductor substrate 28 to form a HEMT device. Although multiple channel layers 12a, 12b, 12c alternating with barrier layers 12d, 12d', e.g., AlGaN layers, are shown, the present disclosure contemplates two or more layers in the stacked channel 12 depending on the desired resistance within the drift region 16. For example, two or more channel layers may be utilized for a lower resistance profile. In embodiments, a majority of the device may be within the drift region 16.

The semiconductor substrate 28 may be used to support a stack of semiconductor materials including one or more wide-bandgap semiconductor layers designated at reference numeral 12. The semiconductor substrate may be a single crystalline semiconductor material. The single crystalline semiconductor material may be Si, SiGe, SiGeC, SiC, GaAs, InAs, InP, and other III/V or II/VI compound semiconductors. As a non-limiting illustrative example, the wide-bandgap semiconductor layer may comprise, in a layered stack of semiconductor materials, a seed layer, e.g., AlN, on the underlying single crystalline semiconductor material, with a buffer layer (e.g., AlGaN/GaN superlattice). The stack of materials may be formed by conventional epitaxial growth processes or other known deposition methods, e.g., metal-organic chemical vapor deposition (MOCVD) or molecular beam epitaxy (MBE). The stacked channel region 12 may be provided on the buffer layer.

In embodiments, the channel region 12 may include layers 12a, 12b, 12c, 12d, 12d' in the drift region 16. The layers 12a, 12b, 12c, 12d, 12d' may extend from the gate structure 14 to the ohmic contact 22 and from the gate structure 14 to under a source region 30 (e.g., under a source contact 32). The channel layer 12c and/or barrier layer 12d' may connect to the source contact 30. The channel layers 12a, 12b, 12c may be, for example GaN, which are separated by the barrier layers comprising AlGaN material 12d in the drift region 16 and under the source region. In embodiments, the source region may include a source contact as designated at reference numeral 32. A passivation layer 34 may be provided over the multiple layers of material 12a, 12b, 12c, 12d, 12d' of the stacked channel 12 and portions of the gate structure 14 and, more particularly, over the barrier layer 12d'. The passivation layer 34 may be silicon nitride material, as an example.

Still referring to FIG. 1, the buried isolation structure 24 may be provided under the p-doped gate structure 14, extending through the layers 12a, 12b, 12d of the stacked channel 12. In embodiments, the buried isolation structure 24 will prevent a conduction path from forming in the layers 12a, 12b, 12d under the gate structure 14, resulting in a single channel layer 12c under the gate structure 14. The buried isolation structure 24 may be, for example, a region of semiconductor material that has undergone modification using an ion implantation process. For example, the buried isolated crystal region may be disordered or amorphized semiconductor material (e.g., layers 12a, 12b, 12d) formed by an ion implantation process. In embodiments, the ion implantation process may utilize an inert or noble gas such as, for example, nitrogen, argon or gallium; although other inert or noble gases are also contemplated herein. In further embodiments, this region may be counter-doped using elements that render it p-type, such as magnesium or carbon. In this way, a single channel layer, e.g., top layer 12c, is provided under the gate structure 14.

FIG. 1 further shows the buried via structure 18 and buried via structure 20 in the drift region 16. The buried via structure 18 may be under any field plate 36 and the buried via structure 20 may be under and connected to the drain ohmic contact 22. The buried via structures 18, 20 may electrically connect the multiple layers of GaN material 12a, 12b, 12c and AlGaN 12d, 12d' to form a parallel conduction path in the drift region 16. For example, the buried via structure 18 shorts (e.g., straps) together the multiple layers of GaN material 12a, 12b, 12c and AlGaN material 12d, 12d' between the gate structure 14 and the drain metal, e.g., drain ohmic contact 22, thereby reducing the overall resistance in the drift region 16; whereas the buried via structure 20 will electrically conduct the voltage of the multiple layers 12a, 12b, 12c, 12d, 12d' to the drain ohmic contact 22. In this way, multiple layers of GaN material 12a, 12b, 12c and AlGaN material 12d, 12d' can support a large voltage load in the drift region 16 while also reducing the overall resistance, by conducting carriers in each channel.

In embodiments, the buried via structure 18 may be under any field plate 36 and may be used to tune the device by moving closer to or farther away from the gate structure 14, e.g., raise or lower the resistance within the drift region 16. For example, moving the buried via structure 18 closer to the gate structure 14 will lower the resistance in the drift region 16; whereas, moving the buried via structure 18 closer to the drain ohmic contact 22 will increase the resistance in the drift region 16, by modulating the fraction of the drift region that comprises the stacked channel region. The buried via structures 18, 20 and the field plates 36 may be any metal such as, for example, TiAl, TiN or other refractory metal. The buried via structures may also be doped semiconductor, such as, for example, n-doped GaN.

The buried via structures 18, 20 and the field plates 36 may be formed by conventional lithography, etching and deposition processes. For example, the buried via structures 18, 20 and the field plates 36 may be fabricated by depositing a resist over an underlying material (e.g., the layer 12d' for the buried via structures 18, 20), exposing the resist to energy (light) and developing the resist utilizing a conventional resist developer to form a pattern (opening). An etching process with a selective chemistry, e.g., reactive ion etching (RIE), will be used to transfer the pattern from the patterned photoresist layer to the underlying material(s) to form one or more trenches. Following the resist removal by a conventional oxygen ashing process or other known stripants, conductive material can be deposited by any conventional deposition processes, e.g., chemical vapor deposition (CVD) processes. Any residual material on the surface of the underlying material can be removed by conventional chemical mechanical polishing (CMP) processes.

FIG. 1 further shows the gate structure 14 formed over the barrier layer 12d', top channel layer 12c and buried isolation structure 24. To form the gate structure 14, a p-doped layer may be formed over the top barrier layer 12d, which is patterned to form the p-doped gate structure 14. The p-doped gate layer may be epitaxially grown and may include an in-situ doping, e.g., p-type doping such as magnesium (Mg), as is known in the art. The p-doped layer may have multiple layers, and may include GaN, AlGaN, InGaN or other semiconductors. These layers may also be graded or stepped in composition or doping. An optional undoped thin GaN layer or $Si_3N_4$ material may be provided on the surface of the p-doped gate structure 14 as shown at reference numeral 14a. This additional layer 14a may be used as an etch stop. The layer 14a may be formed by any conventional or epitaxial deposition method, e.g., CVD or ALD, and patterned with the gate material using conventional lithography and etching processes as known in the art such that no further explanation is required for a complete understanding of the present disclosure.

A gate metal 38, e.g., TiN, TiAl and/or TaN, may be provided on top of and in contact with the semiconductor material of the p-doped gate structure 14. The gate metal 38 may be one or more refractory metals or their compounds, e.g., titanium (Ti), titanium nitride (TiN), tantalum (Ta), tantalum nitride (TaN), palladium (Pd), tungsten (W), or tungsten silicide ($WSi_2$). In embodiments, the gate metal 38 may also be used to form any of the field plates 34. The gate metal 38 may be deposited by conventional deposition methods, e.g., CVD, plasma vapor deposition (PVD), atomic layer deposition (ALD) and other techniques, and patterned by conventional etching processes, e.g., reactive ion etching (RIE), prior to the deposition of interlevel dielectric material 40, and may be formed or patterned in multiple steps, such that the gate metal may have several components to its profile and shape. Particularly, the gate metal may extend closer to the edges of the p-doped gate material at the lower portion of the gate metal structure 38 than at the top, and may include steps or tapers in its profile, or may include multiple materials.

FIG. 1 further shows sidewall spacers 42, 44 on sidewalls of the gate structure 14. In embodiments, the sidewall spacers 42, 44 may be provided between the gate metal 38 and the passivation layer 34; although other configurations are contemplated herein, e.g., without any sidewall spacers present. The sidewall spacer 44, for example, may also be provided between the gate structure 14 and the passivation layer 34. The sidewall spacers 42, 44 may be any combination of oxide or nitride material, as examples. The sidewall spacers 42, 44 may be formed by a deposition (e.g., CVD) and etching process (e.g., anisotropic etching) as is known in the art such that no further explanation is required for a complete understanding of the present disclosure.

FIG. 1 also shows back end of the line metal material 46 formed within and, in embodiments, on top of the interlevel dielectric material 40. The metal material 46 includes, for example, via interconnects and wiring structures connecting to the field plates 36 and ohmic contacts in the drain region and source region. The metal material 46 may be the same or different metal material as the gate metal 38. For example, the metal material 46 may be aluminum (Al), copper (Cu) or other conductive material used for wiring layers. In embodiments, the metal material 46 may be deposited after patterning, e.g., lithography and etching processes, of different layers of the interlevel dielectric material 40. As is known in the art, there may be multiple levels of back end of line metals 36 with vertical spacing between these levels.

Figure 2:
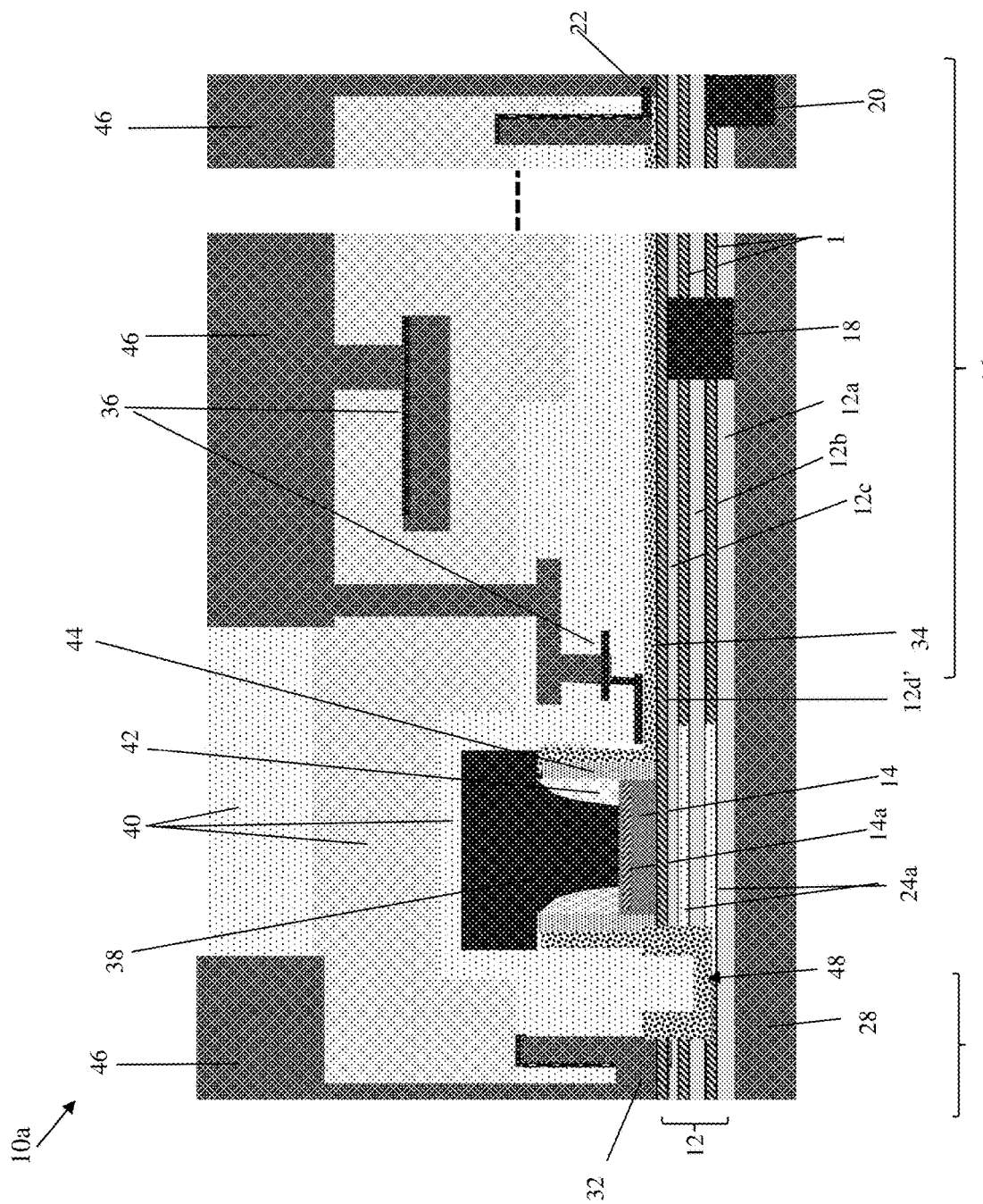
FIG. 2 shows a structure in accordance with additional aspects of the present disclosure.

FIG. 2 shows a structure in accordance with additional aspects of the present disclosure. The structure 10a of FIG. 2 is similar to the structure 10 of FIG. 1 with the exception of the buried isolation structure 24. For example, in FIG. 2, the channel layers 12a, 12b, 12c under the gate structure 14 may be separated and electrically isolated by alternating layers of dielectric material 24a. In the drift region 16 and under the source contact 32, though, the stacked channel 12 may still include the channel layers 12a, 12b, 12c, e.g., GaN, alternating with the barrier layers 12d, 12d', e.g., AlGaN material. The buried via structures 18, 20 will still connect, e.g., electrically and physically, the alternating layers 12a, 12b, 12c, 12d, 12d' to form a single, parallel conduction path in the drift region 16.

Moreover, a trench 48 may be formed through the channel layers 12a, 12b, 12c and barrier layers 12d. 12d'. In embodiments, the trench 48 is adjacent to the gate structure 14 and, more particularly, between the gate structure 14 and the source contact 32 within the source region 30. The trench 48 may be lined with the passivation material 34 and filled with dielectric material 40. As further noted herein, the trench 48 may be one or more trenches used to remove the layers 12d from under the gate structure 14. The remaining features of the structure 10a are similar to the structure 10 of FIG. 1.

Figure 3A:
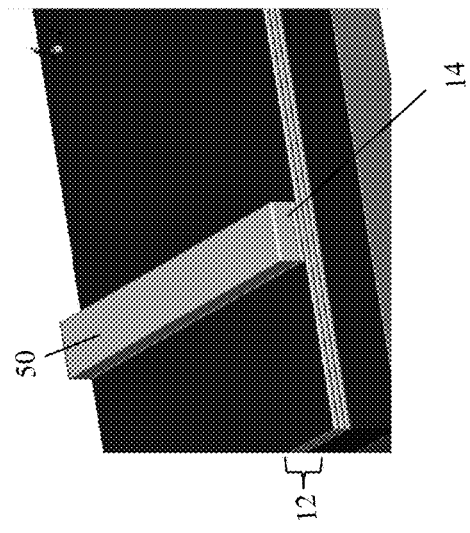
FIGS. 3A-3E show fabrication processes for manufacturing the structure of FIG. 1 in accordance with aspects of the present disclosure.

FIGS. 3A-3E show fabrication processes for manufacturing the structure of FIG. 1 in accordance with aspects of the present disclosure. In FIG. 3A, the gate structure 14 is formed by depositing and patterning a hard mask (e.g., silicon nitride or other dielectric or metal) 50 over p-GaN material. The patterning process may be a conventional RIE process. The mask 50 may remain on the structure or may be removed.

Figure 3B:
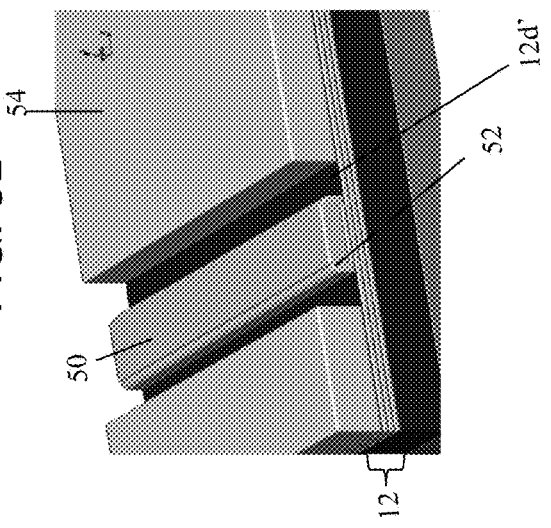

In FIG. 3B, sidewall spacers 52 may be formed on sidewalls of the mask 50 and the gate structure 14. The sidewall spacers 52 may be a nitride material as an example, formed by a conventional deposition process, e.g., CVD, followed by an anisotropic etching process. A patterned mask 54 may be formed, e.g., deposited and patterned, on the exposed stacked channel 12, e.g., barrier layer 12d', to form openings exposing portions of the stacked channel 12 adjacent to the gate structure 14. The mask 54 may include a layer of a light-sensitive material, such as an organic photoresist, applied by a spin coating process, pre-baked, exposed to light projected through a photomask, baked after exposure, and developed with a chemical developer. The implantation mask has a thickness and stopping power sufficient to block masked areas against receiving a dose of the implanted ions.

Figure 3C:
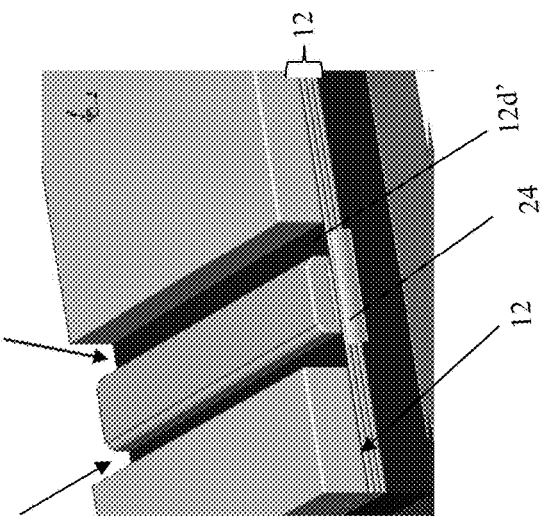

In FIG. 3C, an angled ion implantation process may be performed through the exposed portions of the barrier layer 12d' to form the buried isolation structure 24. In embodiments, the angled implantation process is represented by the arrows and may use, for example, nitrogen, argon or gallium or other noble or inert gases to provide a disordered or amorphized region of semiconductor material. In more specific embodiments, the angled implant may be a dual/quad tilted implant to isolate the lower layers of the stacked channel 12 from the channel layer 12c.

Figure 3D:
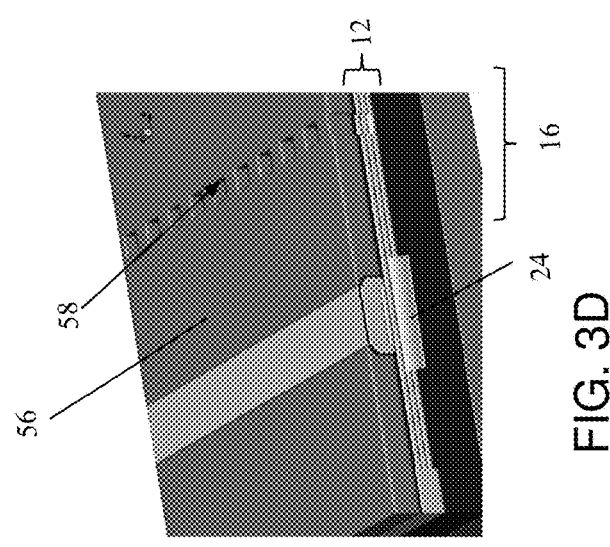

In FIG. 3D, the mask may be replaced with dielectric material 56. In embodiments, the dielectric material 56 may be deposited by a CVD process, followed by a CMP process. Trenches 58 may be formed in the drift region 16 through the dielectric material 56 and the stacked channel materials 12. The trenches 58 may be formed by conventional lithography and etching processes as described herein. In embodiments, a single or multiple trenches may be formed through the dielectric material 56 and the stacked channel 12 to form both the metal via structures 18, 20 of FIGS. 1 and 2.

Figure 3E:
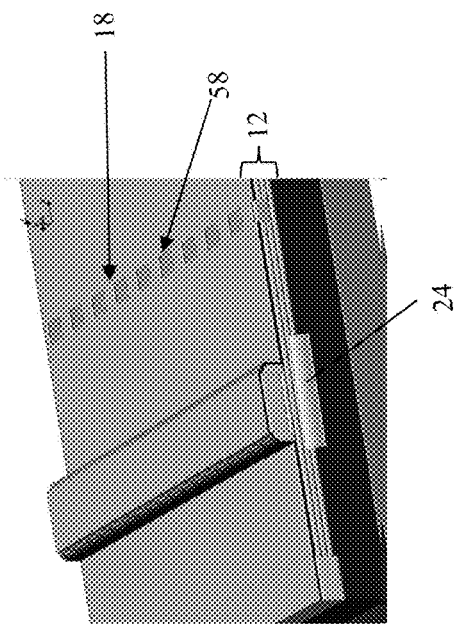

As further shown in FIG. 3E, metal material is formed within the trenches 58 to form the buried via structures 18 as shown, for example, in FIGS. 1 and 2. A similar process may also be used to form the buried via structures 20 as shown in FIGS. 1 and 2. In embodiments, the metal material may be, for example, any conductive metal or combination of metals such as, for example, TiAl, TiN or other refractory metal (e.g., tungsten, etc.). The metal deposition may be a CVD process, followed by a planarization process, e.g., CMP. The metal material may be recessed to the barrier layer 12d', for example. The dielectric material 56 may be stripped using conventional etching or stripping processes. The flow then continues to FIG. 1 as described above to form the gate metal, field plates, via interconnects and other back end of the line structures.

FIGS. 4A-4E show fabrication processes for manufacturing the structure of FIG. 2 in accordance with aspects of the present disclosure. In FIG. 4A, the gate structure 14 is formed by depositing and patterning a hard mask (e.g., silicon nitride or other dielectric or metal) 50 over p-GaN material. The patterning process may be a conventional RIE process. The mask 50 may remain on the structure.

In FIG. 4B, sidewall spacers 52 may be formed on sidewalls of the mask 50 and the gate structure 14. The sidewall spacers 52 may be a nitride material formed by a conventional deposition process, e.g., CVD, followed by an anisotropic etching process. A mask 60, e.g., oxide, may be formed, e.g., deposited and patterned, on the exposed stacked channel 12, e.g., barrier layer 12d'. The pattern of the mask 60 includes a plurality of openings 62, which can be etched through to form trenches 48 adjacent to the gate structure 14 within the stacked channel 12. The mask openings 62 will expose the alternating layers of the stacked channel 12 material underneath the gate structure 14.

In FIG. 4C, a spacer 64 may be formed within the openings 62 and within the trenches 48. In more specific embodiments, the spacer 64 will be formed over the upper layers 12c, 12d' of the stacked channel 12. In this way, the bottom channel layers, e.g., layers 12a, 12b, 12d, will be exposed. The spacer 64 may be formed by conventional deposition processes, e.g., CVD or ALD, followed by an etching process to expose the bottom channel layers 12a, 12b, 12d.

In FIG. 4D, the barrier layers 12d between the channel layers 12a, 12b, 12c may be selectively etched (e.g., removed) under at least part of the gate structure 14 using an etchant that will not attack the material of channel layers 12a, 12b, 12c. For example, the etching may be either a dry isotropic etch or a wet isotropic etch process with a chemistry that is selective to remove, for example, the AlGaN material 12d between the layers of GaN material 12a, 12b, 12c. In this way, voids 66 are formed between the channel layers 12a, 12b, 12c. The etch process may be timed such that the AlGaN material 12d remains within the drift region remains between the channel layers 12a, 12b, 12c. Also, it should be understood by one of skill in the art that the spacer 64 will prevent etching or removal of the barrier layer 12d' over the channel layer 12c.

In FIG. 4E, dielectric material 24a may be deposited within the voids 66 between the channel layers 12a, 12b, 12c. The dielectric material 24a may be deposited by an ALD, CVD or epitaxial process. Residual dielectric material within the trench 48 may be removed by an etch back or recess process. As noted above, the dielectric material 24a may be an oxide which will electrically isolate the channel layers 12a, 12b, 12c under the gate structure 14. The process continues with FIG. 2, including the filling of the trench 48 with passivation and dielectric material, amongst other back end of the line processes as described herein.

Figure 5A:
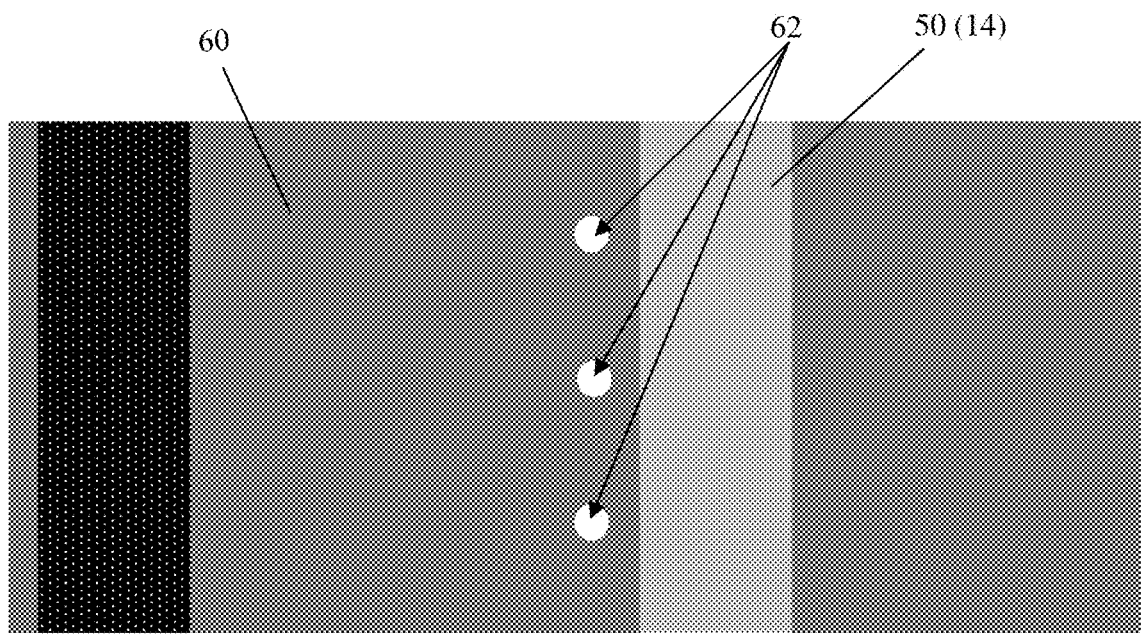
FIG. 5A shows a representative top view of trenches or openings at a first level of the structure of FIG. 2 in accordance with aspects of the present disclosure.
Figure 5B:
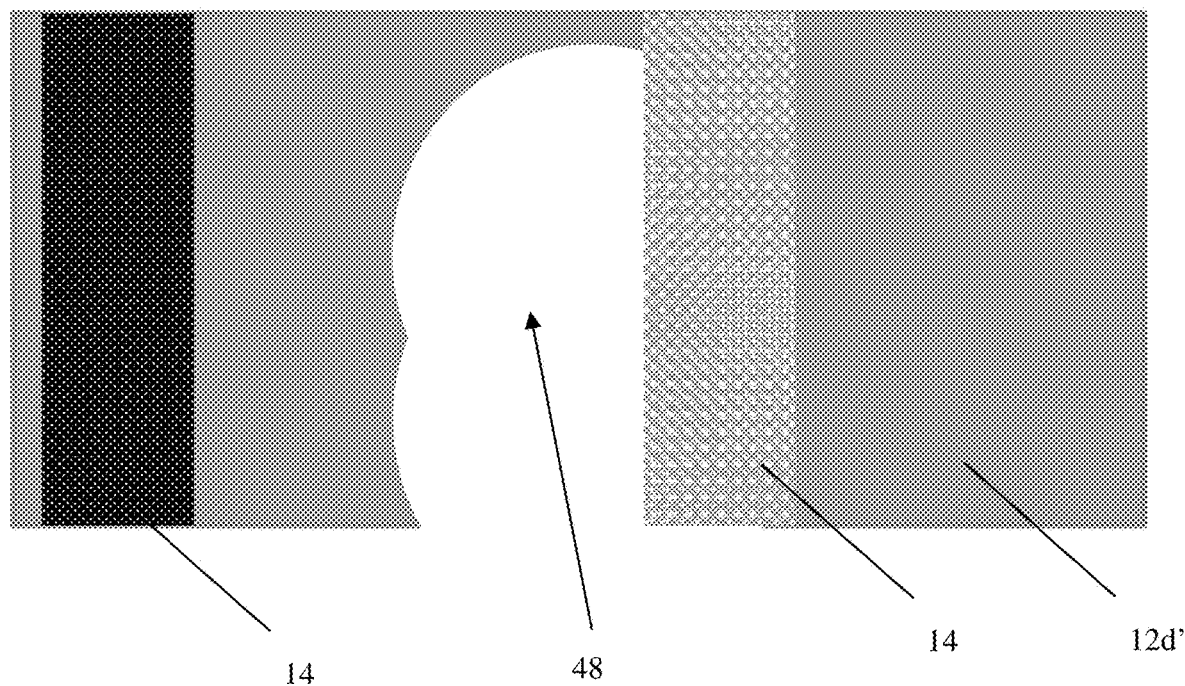
FIG. 5B shows a representative top view of the trenches or at a lower level of the structure of FIG. 2 in accordance with aspects of the present disclosure.

FIG. 5A shows a representative top view of trenches or openings 62 at a first level of the structure of FIG. 2. The openings 62 are formed within the mask 60, adjacent to the patterned mask 50 forming the gate structure 14. At a deeper level, as shown in FIG. 5B, the etching process will form a single trench 48 underneath the openings 62 of FIG. 5A in each of the voids 66.

The HEMT can be utilized as a single device in discrete applications, may be combined in a single package with several other devices of the same or varying types via co-packaging or multi-chip 3D integration techniques, or may be combined with several other devices in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things. Moreover, GaN devices are increasingly being employed in SoC designs where multiple GaN HEMTs are formed on a single substrate.

The method(s) as described above is used in the fabrication of discrete device chips or integrated circuit chips. The resulting chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a gate structure;
   a single channel layer in a channel region under the gate structure;
   a drift region adjacent to the gate structure; and
   multiple channel layers in the drift region coupled to the single channel layer under the gate structure.

2. The structure of claim 1, further comprising a buried isolation structure under the channel region.

3. The structure of claim 2, wherein the buried isolation structure comprises disordered semiconductor material under the single channel layer.

4. The structure of claim 2, wherein the buried isolation structure comprises amorphized semiconductor material under the single channel layer.

5. The structure of claim 1, further comprising a barrier layer over the single channel layer and at least one barrier layer interposed between the multiple channel layers in the drift region.

6. The structure of claim 5, wherein the channel layers comprise GaN and the barrier layers comprise AlGaN.

7. The structure of claim 5, further comprising a first buried via strap connecting the multiple channel layers and the barrier layers to the single channel layer and the barrier layer to form a single conduction path in the drift region and a second buried via strap connecting the multiple channel layers to a drain ohmic contact.

8. The structure of claim 7, wherein the second buried via strap electrically connects to the drain ohmic contact.

9. The structure of claim 1, further comprising multiple channel layers interposed with dielectric material within the channel region.

10. The structure of claim 9, wherein the dielectric material isolates the multiple channel layers from the single channel layer and from one another in the channel region.

11. The structure of claim 10, wherein the single channel layer comprises a top conducting layer in the channel region and remaining channel layers of the multiple channel layers are non-conducting regions in the channel region.

12. The structure of claim 10, further comprising a trench filled with isolation material adjacent to the dielectric material which isolate the multiple channel layers from one another in the channel region.

13. A structure comprising:
    a gate structure;
    a channel region under the gate structure; and
    a drift region adjacent to the gate structure,
    wherein the channel region comprises a single channel and the drift region comprising a stack of channel layers electrically strapped together and connecting to a drain ohmic contact.

14. The structure of claim 13, wherein the single channel comprises a channel layer and a barrier layer and the stack of channel layers comprises alternating channel layers and barrier layers strapped to the channel layer and the barrier layer.

15. The structure of claim 14, further comprising a buried via strapping the channel layer and the barrier layer to the stack of channel layers.

16. The structure of claim 14, further comprising a buried isolation structure under the single channel layer in the channel region.

17. The structure of claim 16, wherein the buried isolation structure comprises amorphized semiconductor material of at least one channel layer and multiple barrier layer under the single channel layer and the barrier layer.

18. The structure of claim 14, wherein the channel region comprises multiple channel layers isolated by dielectric material.

19. The structure of claim 18, further comprising a trench filled with insulator material contacting the multiple channel layers and dielectric material.

20. A method comprising:
    forming a gate structure;
    forming a single channel layer in a channel region under the gate structure;
    forming a drift region adjacent to the gate structure; and
    forming multiple channel layers in the drift region coupled to the single channel layer under the gate structure.

* * * * *